(12) United States Patent
Banba et al.

(10) Patent No.: US 8,080,350 B2
(45) Date of Patent: Dec. 20, 2011

(54) POSITIVE PHOTOSENSITIVE RESIN COMPOSITION, AND SEMICONDUCTOR DEVICE AND DISPLAY THEREWITH

(75) Inventors: Toshio Banba, Tokyo (JP); Ayako Mizushima, Tokyo (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 331 days.

(21) Appl. No.: 12/085,751

(22) PCT Filed: Nov. 17, 2006

(86) PCT No.: PCT/JP2006/322951
§ 371 (c)(1),
(2), (4) Date: May 30, 2008

(87) PCT Pub. No.: WO2007/063721
PCT Pub. Date: Jun. 7, 2007

(65) Prior Publication Data
US 2009/0166818 A1    Jul. 2, 2009

(30) Foreign Application Priority Data

Nov. 30, 2005 (JP) ............................... P2005-346804
Jan. 19, 2006 (JP) ............................... P2006-010837

(51) Int. Cl.
*G03F 7/004* (2006.01)
*G03F 7/30* (2006.01)

(52) U.S. Cl. .......... 430/14; 430/191; 430/192; 430/193; 430/311; 430/319; 430/325; 430/330

(58) Field of Classification Search .................. 430/191, 430/192, 193, 165, 326, 14, 330, 311, 319, 430/325
See application file for complete search history.

(56) References Cited

U.S. PATENT DOCUMENTS

| 4,495,042 | A | 1/1985 | Hayase et al. | |
| 6,232,032 | B1 * | 5/2001 | Nunomura et al. | 430/191 |
| 6,929,891 | B2 * | 8/2005 | Rushkin et al. | 430/18 |
| 6,939,659 | B2 * | 9/2005 | Naiini et al. | 430/190 |
| 7,026,080 | B2 | 4/2006 | Nakayama et al. | |
| 7,332,254 | B2 * | 2/2008 | Sasaki et al. | 430/18 |
| 7,338,737 | B2 * | 3/2008 | Lee et al. | 430/18 |
| 7,374,856 | B2 * | 5/2008 | Suwa et al. | 430/169 |
| 7,435,525 | B2 * | 10/2008 | Hattori et al. | 430/191 |

FOREIGN PATENT DOCUMENTS

| EP | 0 459 395 A2 | 12/1991 |
| EP | 0459395 A2 | 12/1991 |
| EP | 0 961 169 A1 | 12/1999 |
| EP | 0961169 A1 | 12/1999 |
| EP | 1 431 822 A1 | 6/2004 |
| EP | 1431822 A1 | 6/2004 |
| JP | 58-174418 | 10/1983 |
| JP | 11-54934 | 2/1999 |
| JP | 11-95423 | 4/1999 |
| JP | 2000-27266 | 10/2000 |
| JP | 2003-75997 | 3/2003 |
| JP | 2004-93816 | 3/2004 |
| JP | 2005-31642 | 2/2005 |
| JP | 2005-265866 | 9/2005 |
| JP | 2005-266189 | 9/2005 |
| WO | WO 2005109099 A1 * | 11/2005 |

OTHER PUBLICATIONS

Korean Office Action dated Sep. 29, 2010 for Application No. 10-2008-7015711 (6 pages).
European Search Report in EP06832830. Prepared Feb. 25, 2011, mailed Mar. 4, 2011.
Supplementary European Search Report for Application No. EP 06 83 2830 dated Mar. 4, 2011.

* cited by examiner

*Primary Examiner* — John Chu
(74) *Attorney, Agent, or Firm* — Smith, Gambrell & Russell, LLP

(57) ABSTRACT

Disclosed is a positive photosensitive resin composition containing (A) an alkali-soluble resin, (B) a diazoquinone compound, (d1) an activated silicon compound and (d2) an aluminum complex. Also disclosed is a positive photosensitive resin composition containing (A) an alkali-soluble resin, (B) a diazoquinone compound, (C) a compound having two or more oxetanyl groups in one molecule and (D) a catalyst for accelerating the ring-opening reaction of the oxetanyl groups of the compound (C).

18 Claims, 1 Drawing Sheet

POSITIVE PHOTOSENSITIVE RESIN COMPOSITION, AND SEMICONDUCTOR DEVICE AND DISPLAY THEREWITH

TECHNICAL FIELD

The present invention relates to a positive photosensitive resin composition, and a semiconductor device and a display therewith.

BACKGROUND ART

Polybenzoxazole resins and polyimide resins having high heat resistance, excellent electrical and mechanical properties and the like have been used for a surface protective layer or an interlayer insulating layer for a semiconductor chip. For simplifying a process using a polybenzoxazole or polyimide resin, there has been used a positive photosensitive resin composition in which a diazoquinone compound of a photosensitive material, is combined with such a resin (patent document 1).

Such a positive photosensitive resin composition must be heated, after patterning, at a temperature of 300° C. or higher in its use for cyclizing a resin component. However, as semiconductor chip interconnections have been recently finer, the problem of generated thermal damage to a semiconductor chip has been prominent in heating at the high temperature. There have been, therefore, investigations for cyclizing a resin component at a lower temperature, but it is known that a cyclizing rate is reduced if heating temperature for cyclizing is simply lowered, leading to problems in subsequent processes.

There has been investigated, as a method for cyclization at a low temperature, the use of an acid catalyst such as a sulfonic acid and an onium salt.

Meanwhile, recent size reduction of semiconductor chip, acceleration of multilayering of interconnections with higher integration and shift to chip size package (CSP), wafer level package (WLP) or the like have resulted in treatment of wafers with various chemicals in their processing. In these new packages, there has been shifted to the use of a bump instead of conventional wire bonding.

[patent document 1] Japanese Laid-open Patent Publication No. 11-54934

DISCLOSURE OF THE INVENTION

However the related art described in the above publication has room for improvement described below.

When a polybenzoxazole precursor or polyimide precursor in a positive photosensitive resin composition is cyclized at a low temperature, addition of a conventional acid catalyst as a cyclization catalyst can promote cyclization, but its strong acidity causes corrosion of an aluminum circuit, leading to deterioration in reliability. Furthermore, when an acid is present in a state as a positive photosensitive resin composition before patterning, the acid is inactivated by an alkali during patterning and alkali development and thus does not work as a catalyst in a cyclization step.

In view of these problems, the present invention provides a positive photosensitive resin composition which can be cyclized at a lower temperature with reduced corrosion.

When a bump is generally mounted through a reflow using a flux, during which a cured layer of the above positive photosensitive resin comes into direct contact with the flux, often causing folds or cracks in the cured layer of the positive photosensitive resin and thus deterioration in reflow resistance to be problem.

Furthermore, in the field of a display device, a manufacturing process involves various chemicals, which cause the same problems as described above occur during the process.

The present invention further provides a positive photosensitive resin having excellent reflow resistance and solvent resistance.

According to the present invention, there is provided a positive photosensitive resin composition including
 (A) an alkali-soluble resin,
 (B) a diazoquinone compound,
 (d1) an activated silicon compound, and
 (d2) an aluminum complex.

Using the particular components (d1) and (d2), an acid generates in the cyclization step after the alkali development process and can properly act as a catalyst while corrosion of an aluminum circuit can be prevented.

According to the present invention, there is also provided a positive photosensitive resin composition including
 (A) an alkali-soluble resin,
 (B) a diazoquinone compound,
 (C) a compound having two or more oxetanyl groups in one molecule, and
 (D) a catalyst for accelerating the ring-opening reaction of the oxetanyl groups of compound (C).

The use of the particular component (C) can give excellent reflow resistance and solvent resistance.

According to the present invention, there is also provided a patterning process including
 applying any of the positive photosensitive resin compositions described above on a substrate to form a resin layer,
 irradiating a desired area in the resin layer with an active energy beam,
 developing the resin layer after the irradiation with an active energy beam and then heating the resin layer.

There is also provided a semiconductor device, including
 a semiconductor substrate,
 a semiconductor chip formed in the semiconductor substrate,
 a protective layer or insulating layer formed over the semiconductor chip,
 wherein the protective layer or insulating layer is a layer formed by applying, developing and heating any of the above positive photosensitive resin compositions.

There is also provided a display including a substrate for a display device, a flattened layer or insulating layer covering the surface of the substrate for a display device and a display device formed over the substrate for a display device,
 wherein the flattened layer or insulating layer is a layer formed by applying, developing and heating any of the above positive photosensitive resin compositions.

According to the present invention, there is also provided a process for manufacturing a semiconductor device including a semiconductor chip and a protective layer or insulating layer formed over the semiconductor chip, including
 applying a positive photosensitive resin composition on the semiconductor element to form a resin layer,
 irradiating a desired area in the resin layer with an active energy beam,
 developing the resin layer after the irradiation with an active energy beam, and then
 heating the resin layer to form the protective layer or insulating layer,
 wherein the positive photosensitive resin composition is any of the above positive photosensitive resin compositions.

According to the present invention, there is also provided a process for manufacturing a display including a substrate for a display device, a flattened layer or insulating layer covering the surface of the substrate for a display device and a display device formed over the substrate for a display device, including applying a positive photosensitive resin composition on the substrate to form a resin layer, irradiating a desired area in the resin layer with an active energy beam, developing the resin layer after the irradiation with an active energy beam, and then heating the resin layer to form the flattened layer or insulating layer, wherein the positive photosensitive resin composition is any of the above positive photosensitive resin compositions.

According to the present invention, there can be provided a positive photosensitive resin composition which can be cyclized at a lower temperature with reduced corrosion, and a semiconductor device and a display therewith.

According to the present invention, there can be provided a positive photosensitive resin composition with excellent reflow resistance and solvent resistance, and a semiconductor device and a display therewith.

The present invention can provide a highly reliable positive photosensitive resin composition which can give excellent physical properties even after heating a low temperature and which can be suitably used for a protective layer for the surface of a semiconductor chip and an interlayer insulating layer or a flattened layer or insulating layer in a display.

BRIEF DESCRIPTION OF THE DRAWINGS

The above objectives, and other objectives, features and advantages will be more clearly understood with reference to the suitable embodiments described below and an accompanying drawing below.

BEST MODE FOR CARRYING OUT THE INVENTION

Figure 1:
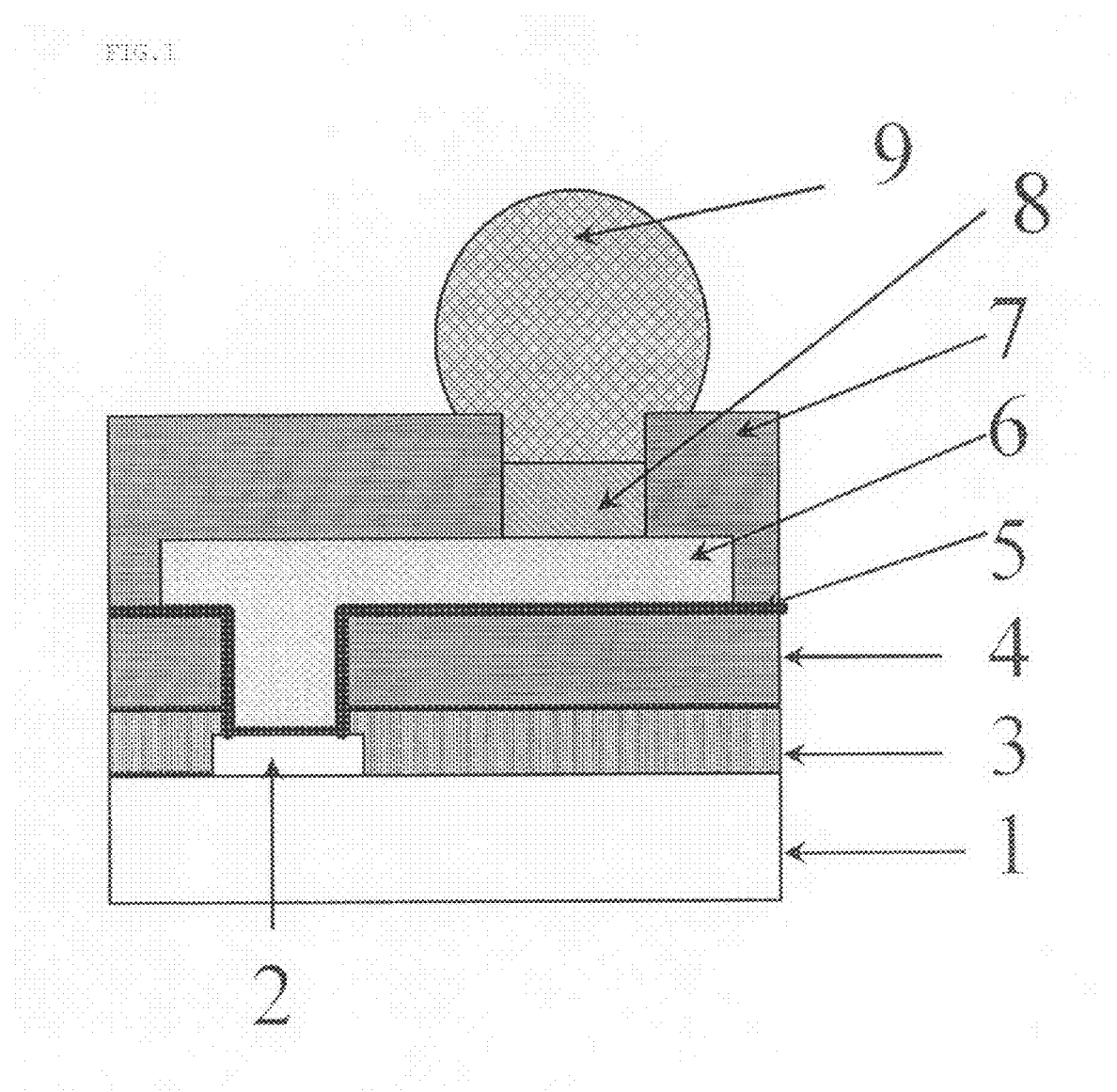
FIG. 1 is a cross-sectional view showing a pad unit in a semiconductor device representing an embodiment of the present invention.

The present invention relates to a positive photosensitive resin composition including (A) an alkali-soluble resin, (B) a diazoquinone compound, (d1) an activated silicon compound and (d2) an aluminum complex.

The present invention also relates to a positive photosensitive resin composition including (A) an alkali-soluble resin, (B) a diazoquinone compound, (C) a compound having two or more oxetanyl groups in one molecule and (D) a catalyst for accelerating the ring-opening reaction of the oxetanyl groups of compound (C), and a semiconductor device therewith and the like.

The components in the positive photosensitive resin composition of the present invention will be detailed. The followings are provided for purposes of illustration and not limitation to the present invention.

Examples of (A) an alkali-soluble resin used in the present invention include cresol type novolac resins, polyhydroxystyrenes and polyamide resins containing a structure represented by general formula (1). Among these, polyamide resins are preferable; specifically, resins having at least one of a polybenzoxazole (PBO) structure and a polyimide (PI) structure and having a hydroxy group, a carboxyl group or a sulfonic group in a main chain or a side chain, resins having a polybenzoxazole precursor structure, resins having a polyimide precursor structure and resins having a polyamide acid ester structure or the like. Such a polyamide resin may be, for example, a polyamide resin represented by formula (1):

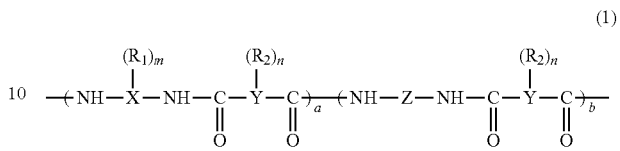

wherein X and Y are an organic group; a and b represent a molar percentage, a+b=100, a is 60 or more and 100 or less and b is 0 or more and 40 or less; $R_1$ is a hydroxy group or —O—$R_3$, which may be the same or different; $R_2$ is a hydroxy group, a carboxyl group, —O—$R_3$ or —COO—$R_3$, which may be the same or different; m is a positive number of 0 to 2; n is a positive number of 0 to 4; $R_3$ is an organic group having 1 to 15 carbon atoms, where when $R_1$s are not a hydroxy group, at least one of $R_2$s must be a carboxyl group and where when $R_2$s are not a carboxyl group, at least one of $R_1$s must be a hydroxy group; Z is represented by —$R_4$—Si($R_6$)($R_7$)—O—Si($R_6$)($R_7$)—$R_5$— where $R_4$ to $R_7$ are an organic group.

A polyamide resin containing a structure represented by general formula (1) is, for example, prepared by reacting a compound selected from an diamine containing X or bis(aminophenol), 2,4-diaminophenol and the like with a compound selected from a tetracarboxylic anhydride containing Y, trimellitic anhydride, a dicarboxylic acid or a dicarboxylic dichloride, a dicarboxylic acid derivative, a hydroxycarboxylic acid, a hydroxydicarboxylic acid derivative and the like. For a dicarboxylic acid, an activated ester type dicarboxylic acid derivative which is preliminary reacted with, for example, 1-hydroxy-1,2,3-benzotriazole may be used for improving a reaction yield.

A polyamide resin containing a structure represented by general formula (1) may be a homopolymer containing only a polybenzoxazole or polyimide structure, or alternatively a polybenzoxazole/polyimide copolymer.

In a polyamide resin containing a structure represented by general formula (1), —O—$R_3$ as a substituent on X and —O—$R_3$ and —COO—$R_3$ as a substituent on Y are groups protected by $R_3$ which is an organic group having 1 to 15 carbon atoms for adjusting solubility in an aqueous alkali solution of a hydroxyl group and a carboxyl group, and if necessary, a hydroxy group and a carboxyl group can be protected. Examples of $R_3$ include formyl, methyl, ethyl, propyl, isopropyl, tertiary-butyl, tertiary-butoxycarbonyl, phenyl, benzyl, tetrahydrofuranyl, tetrahydropyranyl and the like.

By heating, this polyamide resin is cyclodehydrated to give a heat-resistant resin in the form of a polyimide resin, a polybenzoxazole resin or a copolymer of these.

X in general formula (1) may be represented by, for example, the following formulas:

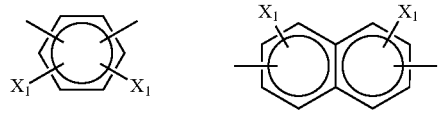

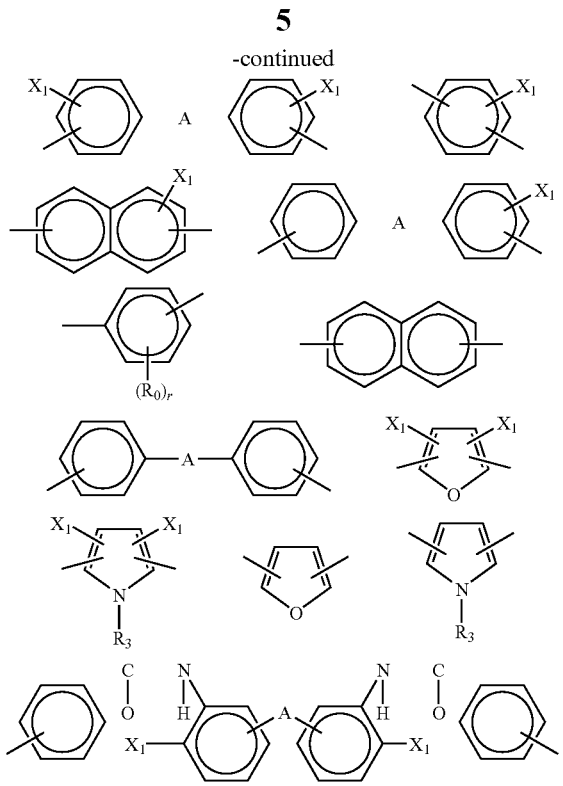

wherein A is —CH$_2$—, —C(CH$_3$)$_2$—, —O—, —S—, —SO$_2$—, —CO—, —NHCO—, —C(CF$_3$)$_2$— or a single bond; X$_1$ is selected from a hydrogen atom, a hydroxy group and OR$_{10}$; R$_{10}$ is an alkyl group having 1 to 15 carbon atoms, where when X$_1$ is a hydroxy group, the hydroxy group is at ortho-position to an amino group; R$_8$ and R$_9$ may be the same or different, R$_8$ is selected from an alkyl group, an alkyl ester group and a halogen atom, which may be the same or different; r is a positive number of 0 to 2; and R$_9$ is selected from a hydrogen atom, an alkyl group, an alkyl ester group and a halogen atom.

Among these, particularly preferred are those represented by the following formulas. These may be used alone or in combination of two or more.

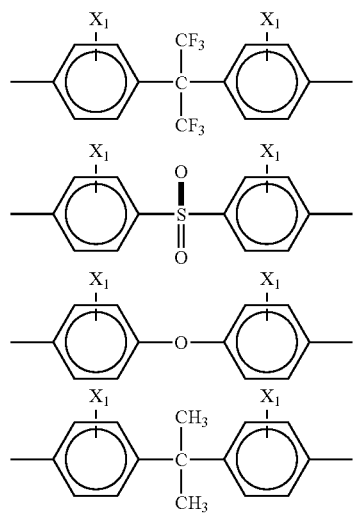

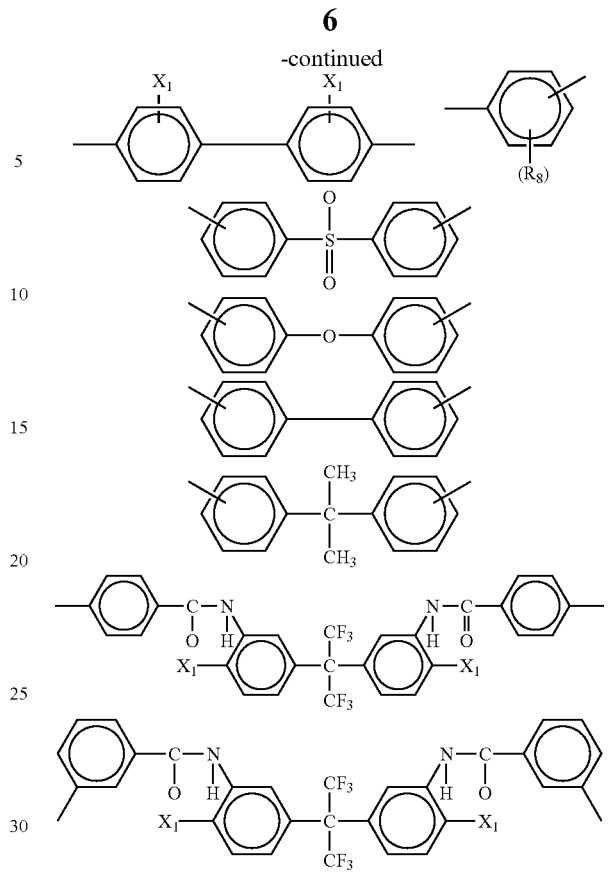

In these formulas, X$_1$ is selected from a hydrogen atom, a hydroxy group and —OR$_{10}$; R$_{10}$ is an alkyl group having 1 to 15 carbon atoms, where when X$_1$ is a hydroxy group, the hydroxy group is at ortho-position to an amino group; R8 is selected from an alkyl group, an alkyl ester group and a halogen atom; and r is an integer of 0 to 2.

Furthermore Y in general formula (1) may be represented by, for example, the following formulas:

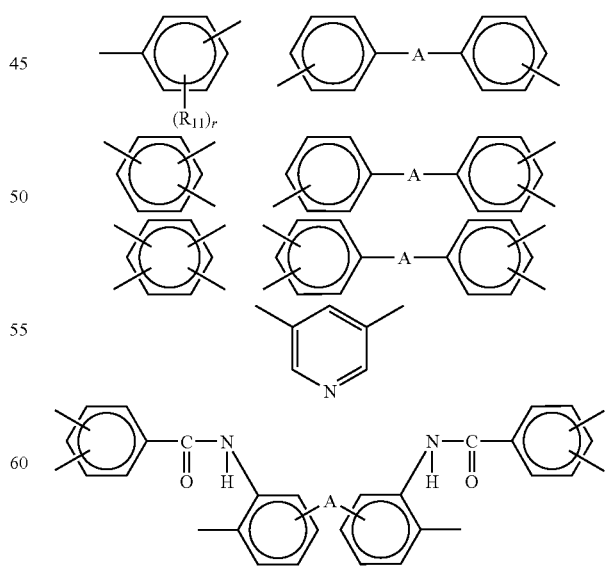

wherein A is —CH$_2$—, —C(CH$_3$)$_2$—, —O—, —S—, —SO$_2$—, —CO—, —NHCO—, —C(CF$_3$)$_2$— or a single bond; $R_{11}$ is selected from an alkyl group, an alkyl ester group and a halogen atom, which may be the same or different; and r is a positive number of 0 to 2.

The compounds represented by the above formulas has a plurality of dangling bonds, of which any dangling bond is linked to a main chain.

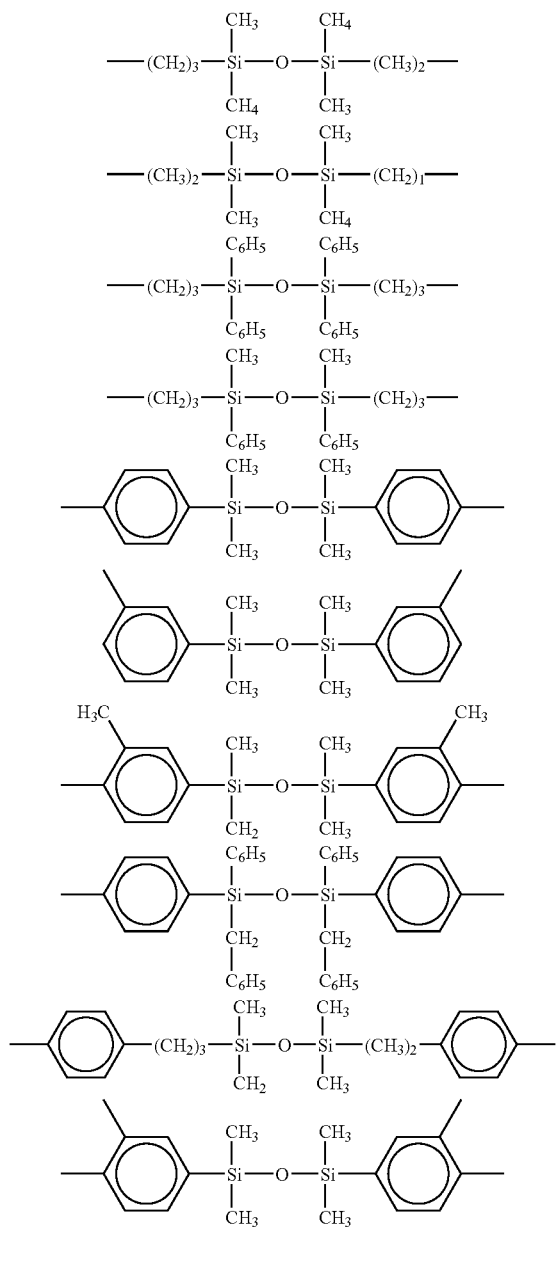

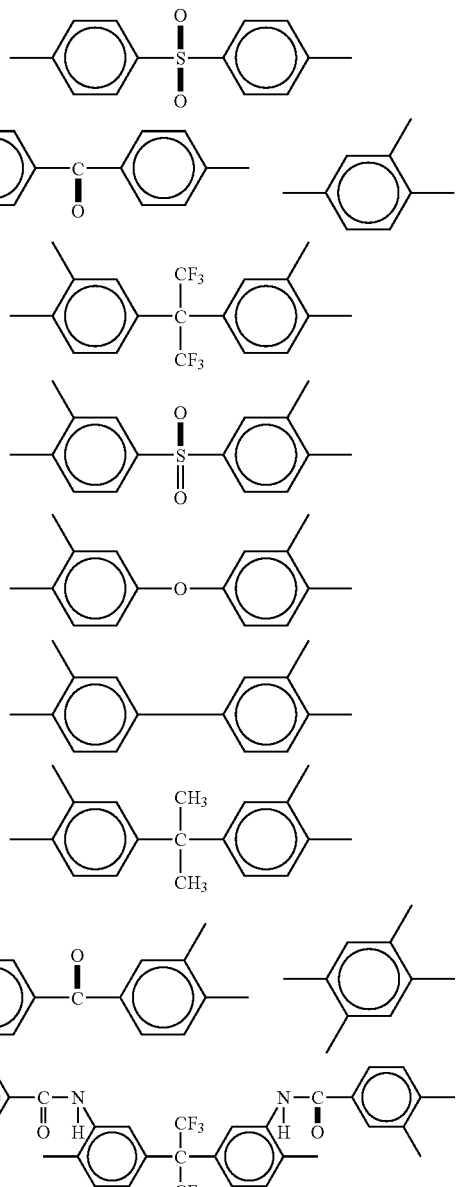

When $R_{12}$ is selected from an alkyl, an alkyl ester group and a halogen atom, which may be the same or different; and r is a positive number of 0 to 2.

Among these, particularly preferred are those represented by the following formulas. These may be used alone or in combination of two or more.

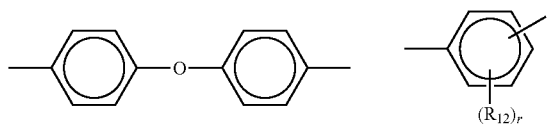

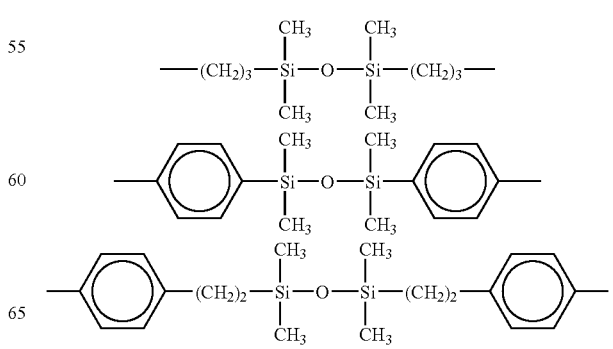

-continued

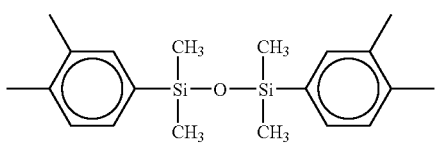

Here, b as a molar percentage of a repeating unit containing Z and Y in general formula (1) may be zero.

In the present invention, it is desirable to cap a terminal in the light of improving the storage stability. For capping, a derivative including an aliphatic group or a cyclic compound group having at least one alkenyl or alkynyl group can be introduced at the terminal of a polyamide represented by general formula (1) as an acid derivative or amine derivative.

Specifically, for example, a compound selected from a diamine having a X structure or bis(aminophenol), 2,4-diaminophenol and the like is reacted with a compound selected from a tetracarboxylic anhydride having a Y structure, trimellitic anhydride, a dicarboxylic acid or a dicarboxylic dichloride, a dicarboxylic acid derivative, a hydroxydicarboxylic acid, a hydroxydicarboxylic acid derivative and the like to synthesize a polyamide resin containing a structure represented by general formula (1), and then the terminal amino group contained in the polyamide resin is preferably capped as an amide, using an acid anhydride or an acid derivative containing an aliphatic or cyclic compound group having at least one an alkenyl or alkynyl group.

Examples of this terminal-capping functional group include those represented by the following formulas:

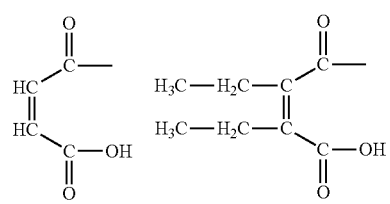

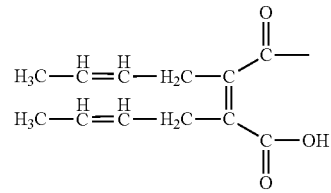

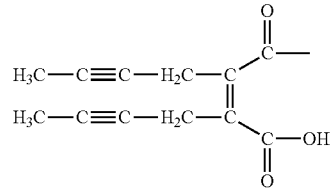

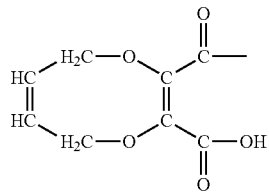

-continued

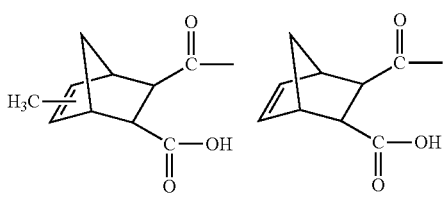

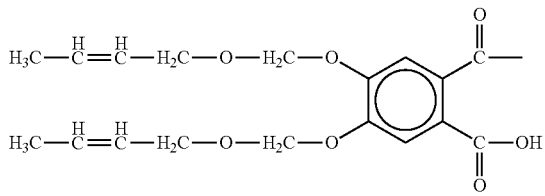

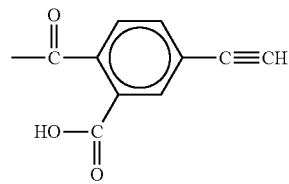

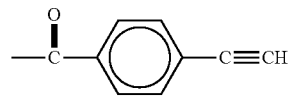

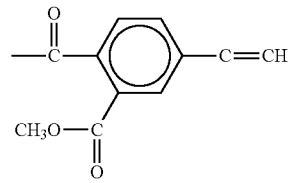

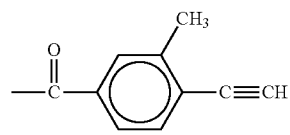

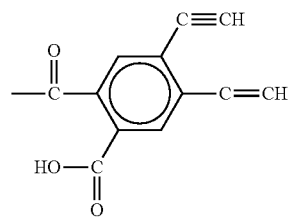

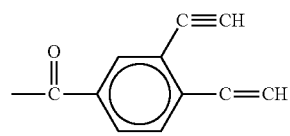

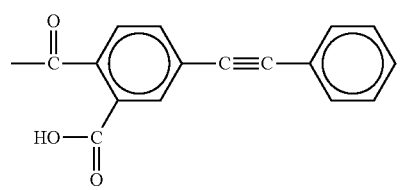

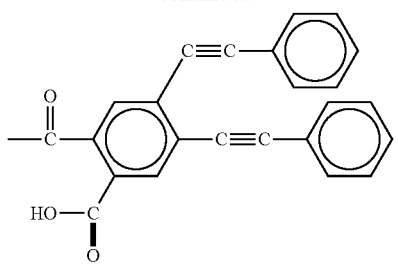

Among these, particularly preferred are those represented by the following formulas. These can be used alone or in combination of two or more. Without being limited to the above method, a terminal acid contained in the polyamide resin may be capped as an amide, using an amine derivative containing an aliphatic or cyclic compound group having at least one alkenyl or alkynyl group.

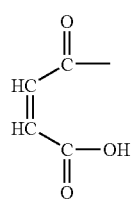

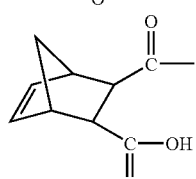

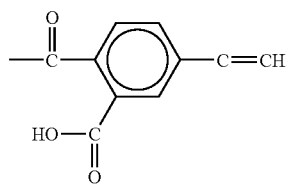

(B) a diazoquinone compound, used in the present invention is a compound having a 1,2-benzoquinone diazide or 1,2-naphthoquinone diazide structure, which is known from U.S. Pat. Nos. 2,772,975, 2,797,213 and 3,669,658. Examples include the compounds represented by the following formulas.

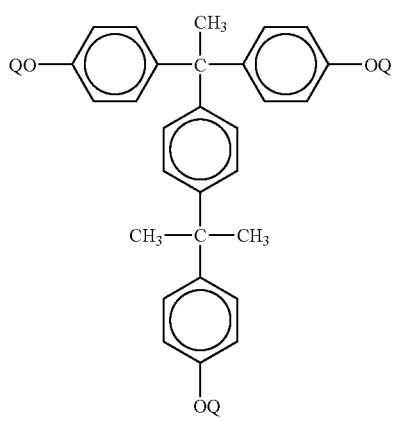

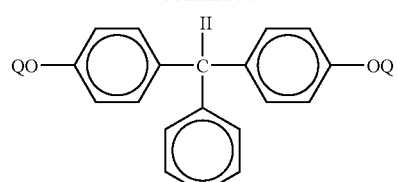

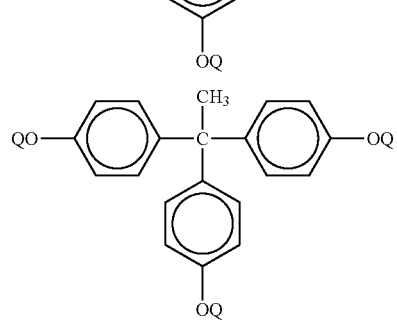

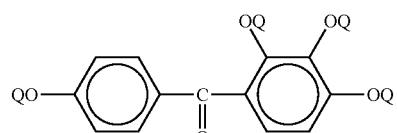

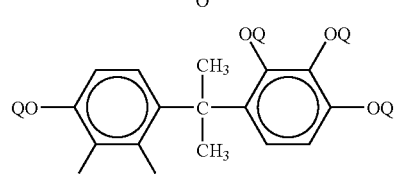

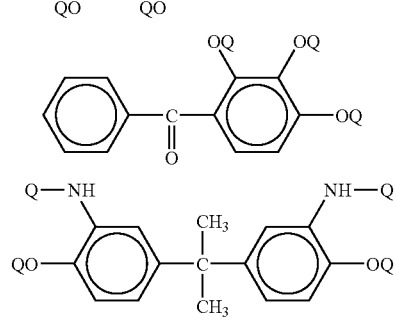

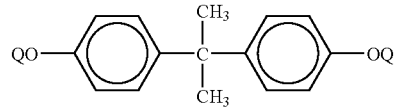

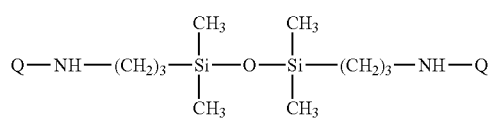

(2)

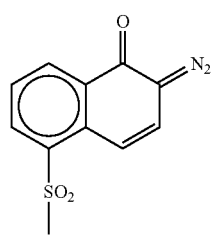

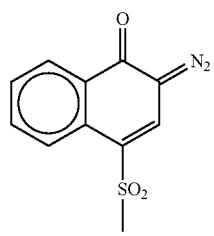

(3)

In these formulas, Q is selected from a hydrogen atom and formula (2) or formula (3). In these compounds, at least one Q is represented by formula (2) or formula (3).

Among these, particularly preferred is an ester of a phenol compound with 1,2-naphthoquinone-2-diazide-5-sulfonic acid or 1,2-naphtoquinone-2-diazide-4-sulfonic acid. Specific examples are those represented by the following formulas. These may be used alone or in combination of two or more.

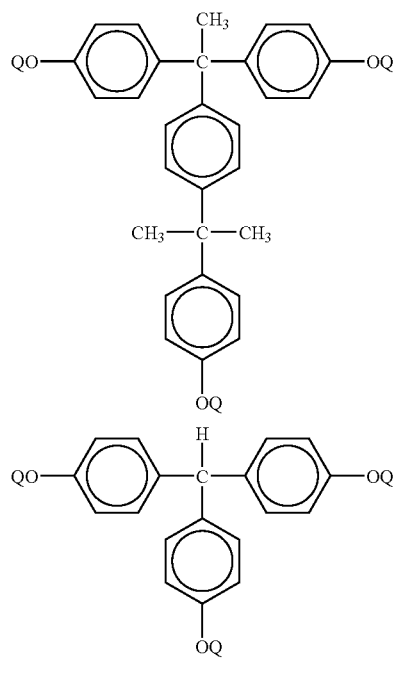

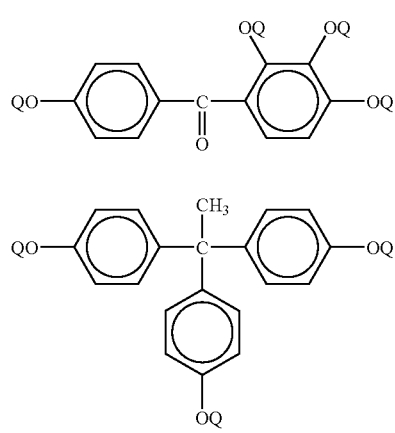

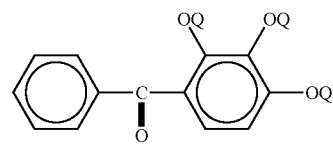

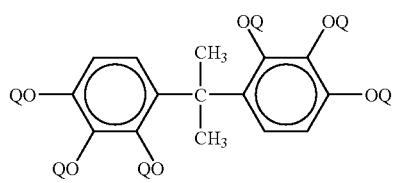

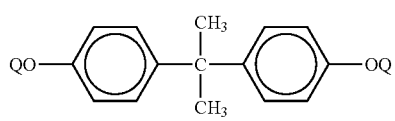

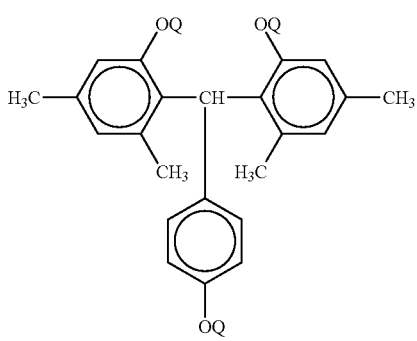

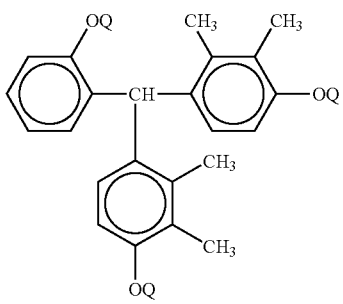

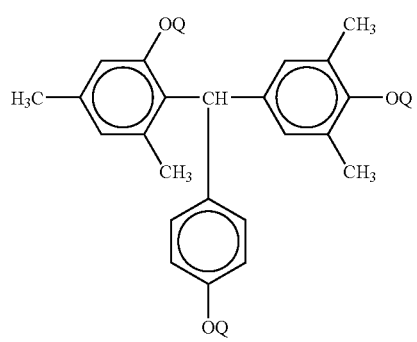

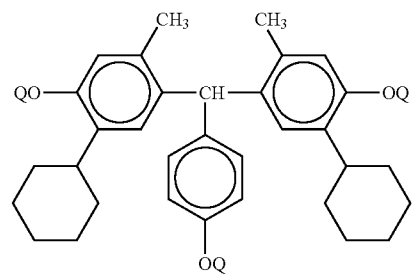

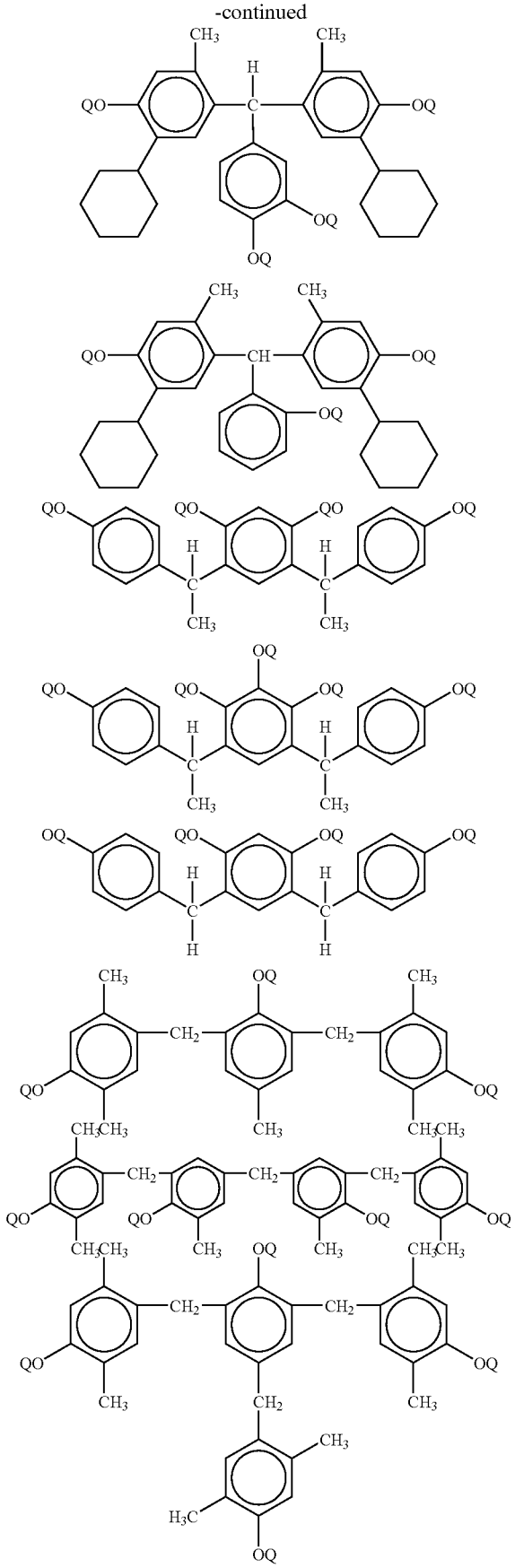
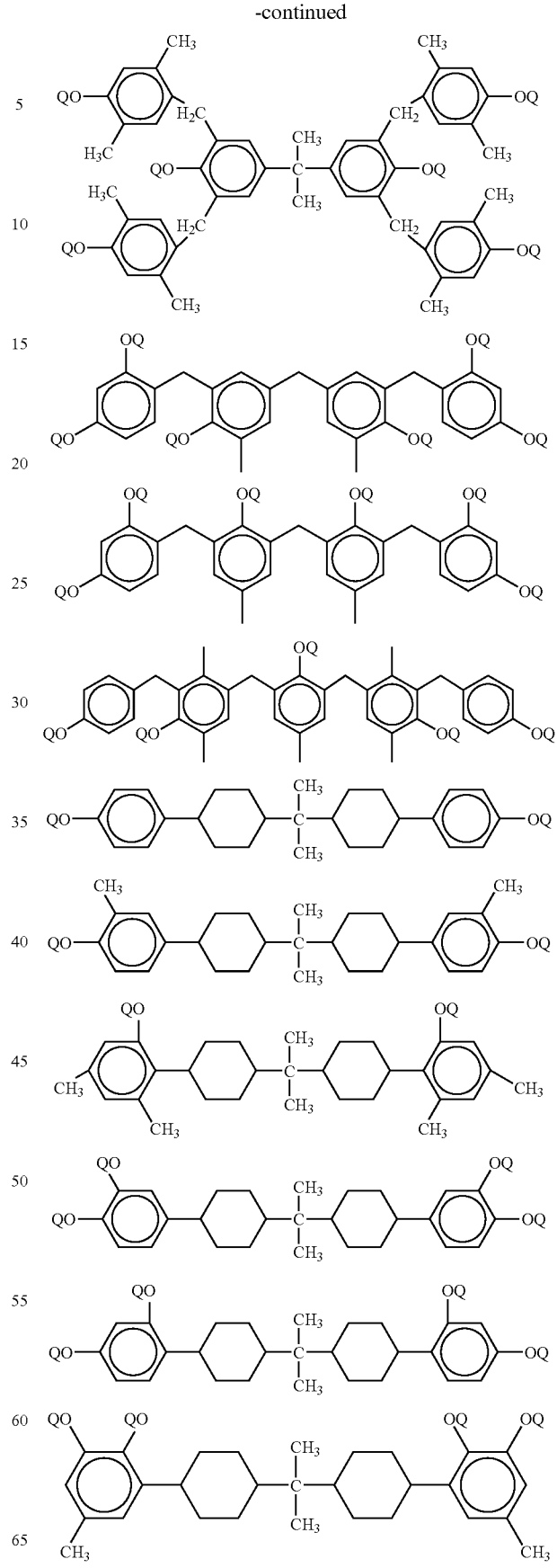

-continued

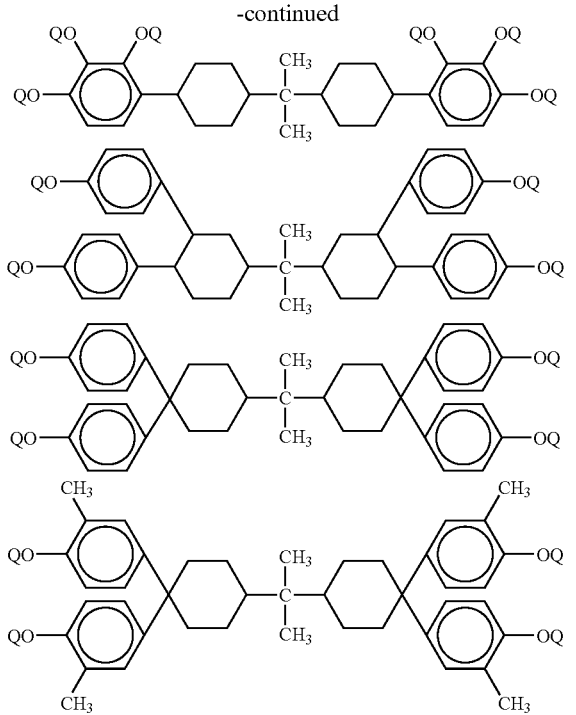

(2)

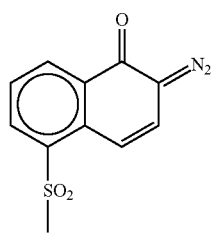

(3)

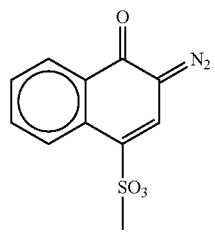

In these formulas, Q is selected from a hydrogen atom and formula (2) or formula (3). In these compounds, at least one Q is represented by formula (2) or formula (3).

The additive amount of (B) a diazoquinone compound used in the present invention is preferably 1 to 50 parts by weight, more preferably 10 to 40 parts by weight to 100 parts by weight of resin (A). The additive amount equal to or more than the lower limit can improve patterning while the amount equal to or lower than the upper limit can improve sensitivity.

(d1) an activated silicon compound is a compound uses in the present invention generating a silanol group by heating. It is preferably a compound having a Si—O—C bond, more preferably an alkoxysilane compound. Among alkoxysilane compounds, suitably used is an activated silicon compound having a R'—Si—(O—R)$_3$ structure where R' is an organic group and R is an alkyl group because it has many reaction sites. Such a compound generates a silanol group by hydrolysis during heating. The silanol group is preferably generated not at a pre-baking temperature in patterning, but during temperature rising in a curing process. A pre-baking temperature is generally 80° C. to 130° C.

Specific examples of an activated silicon compound include alkoxysilane compounds such as diphenyldimethoxysilane, diphenyldiethoxysilane, diphenyldiisopropoxysilane, diphenyldiacetoxysilane, diphenyldiphenoxysilane, triphenylmethoxysilane, triphenylethoxysilane, diphenylvinylethoxysilane, vinyltris(β-methoxyethoxy)silane, vinyltriethoxysilane, vinyltrimethoxysilane, γ-(methacryloxypropyl)trimethoxysilane, β-(3,4-epoxycyclohexyl)ethyltrimethoxysilane, γ-glycidoxypropyltrimethoxysilane, γ-glycidoxypropylmethyldiethoxysilane, N-β-(aminoethyl)-γ-aminopropyltrimethoxysilane, N-β-(aminoethyl)-γ-aminopropylmethyldimethoxysilane, γ-aminopropyltriethoxysilane, N-phenyl-γ-aminopropyltrimethoxysilane, γ-mercaptopropyltrimethoxysilane, triethoxy(4-(trifluoromethyl)phenyl)silane pentafluorophenyltrimethoxysilane or the like, and may include activated silicon compounds represented by the following structure. Among these, preferred are γ-(methacryloxypropyl)trimethoxysilane and the activated silicon compounds having any of the following structures. These may be used alone or in combination of two or more.

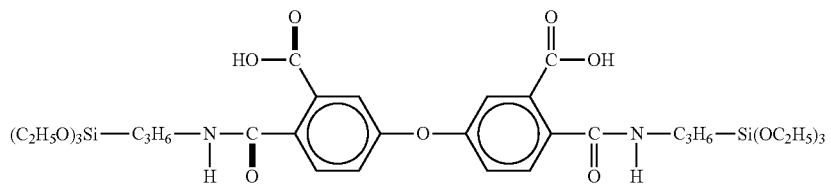

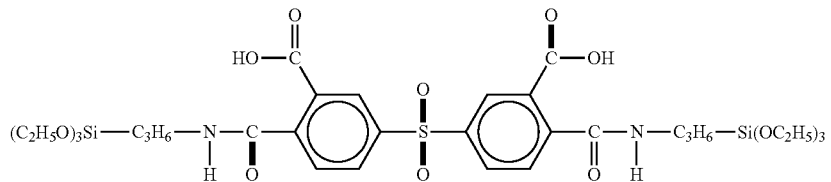

-continued

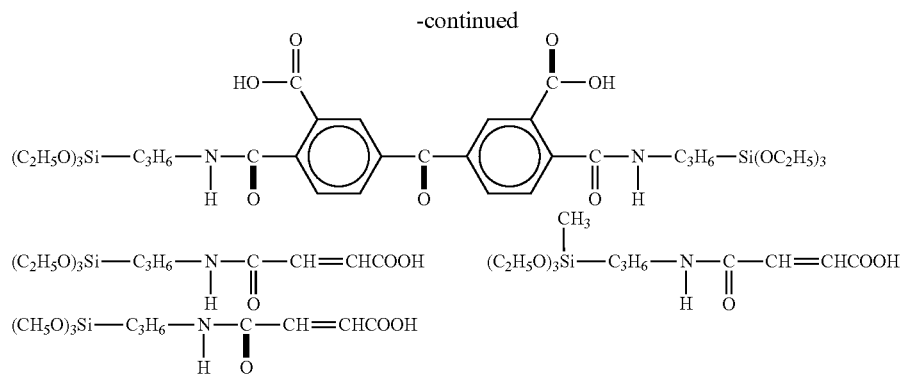

The additive amount of the activated silicon compound is preferably 0.1 to 50 parts by weight, more preferably 1 to 30 parts by weight to 100 parts by weight of an alkali-soluble resin. The amount more than the lower limit results in a reaction with an aluminum complex compound to generate an acid in an adequate amount, while the amount less than the upper limit results in an improved storage stability.

The activated silicon compound has a characteristic that it is inactive to the other resin composition components of the present invention at a room temperature, but when being heated at a certain temperature, it generates a silanol group which initiates a reaction with an aluminum complex compound in the resin composition. After the reaction, there generates a Broensted acid, which would be a catalyst accelerating cyclization of (A) an alkali-soluble resin of the present invention. While the reaction of the activated silicon compound with the aluminum complex compound forms a Broensted acid generates, it forms an aluminum silicate compound. By the coexistence of an activated silicon compound and an aluminum complex compound in a resin composition, there is provided a system that an acid generates not at a room temperature but under heating and the acid accelerates cyclization.

A positive photosensitive resin composition of the present invention is applied on a support, patterned (including prebaking), developed with an alkali, cyclized and the like to be patterned as described later. Here, when an acid is present in an initial positive photosensitive resin composition, a required acid during alkali development is so inactivated that in the cyclization process, cyclization cannot be adequately accelerated. It is, therefore, desirable that a cyclization accelerator generates as an acid for the first time at the cyclization process.

In the present invention, (d2) an aluminum complex is preferably an aluminum chelate complex; for example, aluminum ethylacetoacetate diisopropylate, aluminum tris(ethylacetoacetate), aluminum tris(acetylacetonate), alkylacetoacetate aluminum diisopropylate, aluminum bisethylacetoacetate monoacetylacetonate or the like. Among these, preferred are aluminum tris(acetylacetonate) and aluminum ethylacetoacetate diisopropylate. These may be used alone or in combination of two or more.

The additive amount of the aluminum complex is preferably 0.1 to 20 parts by weight, more preferably 0.5 to 10 parts by weight to 100 parts by weight of an alkali-soluble resin. The amount more than the lower limit results in more effective acceleration of cyclization while the amount equal to or less than the upper limit results in reducing problems such as precipitation during cryopreservation.

In the present invention, (C) a compound having two or more oxetanyl groups in one molecule is a compound having two or more four-membered cyclic ether structures in one molecule, which may have a cation ring-opening polymerization reaction or an addition reaction with a carboxylic acid, a thiol or a phenol. Examples may include, but not limited to, 1,4-bis{[(3-ethyl-3-oxetanyl)methoxy]methyl}benzene, bis[1-ethyl(3-oxetanyl)]methyl ether, 4,4'-bis[(3-ethyl-3-oxetanyl)methoxymethyl]biphenyl, 4,4'-bis(3-ethyl-3-oxetanylmethoxy)biphenyl, ethyleneglycol bis(3-ethyl-3-oxetanylmethyl)ether, diethyleneglycol bis(3-ethyl-3-oxetanylmethyl)ether, bis(3-ethyl-3-oxetanylmethyl) diphenoate, trimethylolpropane tris(3-ethyl-3-oxetanylmethyl)ether, pentaerythritol tetrakis(3-ethyl-3-oxetanylmethyl)ether, poly[[3-[(3-ethyl-3-oxetanyl)methoxy]propyl]silasesquioxane] derivatives, oxetanyl silicate, phenol novolac type oxetane, 1,3-bis[(3-ethyloxetan-3-yl)methoxy]benzene and the like. These may be used alone or in combination of two or more.

The additive amount of the compound containing oxetanyl groups is preferably 1 part by weight or more to 100 parts by weight of an alkali-soluble resin. The amount of 1 parts by weight or more can provide adequate reflow resistance and chemical resistance.

(D) a catalyst for accelerating the ring-opening reaction of the oxetanyl groups of compound (C) used in the present invention is added for accelerating a reaction of a compound containing an oxetanyl group, including onium salts, halogenated organic compounds, quinone diazide compounds, sulfone compounds and the like. Specific examples of an onium salt include diazonium salts, ammonium salts, iodonium salts, sulfonium salts, phosphonium salts, arsonium salts, oxonium salts having unsubstituted or symmetrically or unsymmetrically substituted alkyl, alkenyl, aralkyl, aromatic and heterocyclic groups. Specific examples of a counter anion to such an onium salt include compounds capable of forming a counter anion with no particular restrictions; for example, boronic acid, arsenic acid, phosphoric acid, antimonic acid, sulfonic acids, carboxylic acids or their halogenated derivatives. A halogenated organic compound may be any halogenated derivative thereof, halogenated organic compounds include halogenated compounds of an organic compound with no particular restrictions, and various known compounds may be used; specific examples include various compounds such as halogen-containing oxadiazole compounds, halogen-containing triazine compound, halogen-containing acetophenone compounds, halogen-containing benzophenone compounds, halogen-containing sulfoxide compounds, halogen-containing sulfone compounds, halogen-containing thiazole compounds, halogen-containing oxazole compounds, halogen-containing triazole compounds, halogen-containing 2-pyrone compounds, halogen-containing aliphatic hydrocarbon compounds, halogen-containing aromatic hydrocarbon compounds, other halogen-containing heterocyclic compounds, sulfenyl halide compounds or the like. Further examples of a halogenated organic compound may include tris(pentafluorophenyl)borane, pentafluorophenylboronic acid, tris(2,3-dibromopropyl)phosphate, tris(2,3-dibromo-3-chloropropyl)phosphate, chlorotetrabromoethane, hexachlorobenzene, hexabromobenzene, hexabromocyclododecane, hexabromobiphenyl, tribromophenyl allyl ether, tetrachlorobisphenol-A, tetrabromobisphenol-A, bis(bromoethyl ether) tetrabromobisphenol-A, bis(chloroethyl ether)tetrachlorobisphenol-A, tris(2,3-dibromopropyl)isocyanurate, 2,2-bis(4-hydroxy-3,5-dibromophenyl)propane, 2,2-bis(4-hydroxyethoxy-3,5-dibromophenyl)propane, dichlorodiphenyltrichloroethane, benzenehexachloride, pentachlorophenol, 2,4,6-trichlorophenyl-4-nitrophenyl ether, 2,4-dichlorophenyl-3'-methoxy-4'-nitrophenyl ether, 2,4-dichlorophenoxyacetic acid, 4,5,6,7-tetrachlorophthalide, 1,1-bis(4-chlorophenyl)ethanol, 1,1-bis(4-chlorophenyl)-2,2,2-trichloroethanol, ethyl-4,4-dichlorobenzylate, 2,4,5,4'-tetrachlorodiphenyl sulfide, 2,4,5,4'-tetrachlorodiphenyl sulfone and the like. Specific examples of a quinone diazide compound include o-quinone azide compounds including sulfonates of a quinone diazide derivative such as 1,2-benzoquinonediazide-4-sulfonic acid ester, 1,2-naphthoquinonediazide-4-sulfonic acid ester, 1,2-naphthoquinonediazide-5-sulfonic acid ester, 1,2-naphthoquinonediazide-6-sulfonic acid ester, 2,1-naphthoquinonediazide-4-sulfonic acid ester, 2,1-naphthoquinonediazide-5-sulfonic acid ester, 2,1-naphthoquinonediazide-6-sulfonic acid ester, sulfonic acid ester of the other quinine diazide derivative, 1,2-benzoquinonediazide-4-sulfonic acid chloride, 1,2-naphthoquinonediazide-4-sulfonic acid chloride, 1,2-naphthoquinonediazide-5-sulfonic acid chloride, 1,2-naphthoquinonediazide-6-sulfonic acid chloride, 2,1-naphthoquinonediazide-4-sulfonic acid chloride, 2,1-naphthoquinonediazide-5-sulfonic acid chloride, 2,1-naphthoquinonediazide-6-sulfonic acid chloride, sulfonic acid chloride of the other, or the like. Furthermore, an acid generated by combining a silicon compound with an aluminum chelate complex can be also suitably used. These active compounds acting as a catalyst may be used alone or in combination of two or more.

An activated silicon compound and an aluminum complex compound may be selected from those described above.

A positive photosensitive resin composition in the present invention may contain, if necessary, additives such as a leveling agent, a silane coupling agent and the like.

In the present invention, these components are dissolved in a solvent to prepare a varnish, which is used. Examples of the solvent include N-methyl-2-pyrrolidone, γ-butyrolactone, N,N-dimethylacetamide, dimethylsulfoxide, diethyleneglycol dimethyl ether, diethyleneglycol diethyl ether, diethyleneglycol dibutyl ether, propyleneglycol monomethyl ether, dipropyleneglycol monomethyl ether, propyleneglycol monomethyl ether acetate, methyl lactate, ethyl lactate, butyl lactate, methyl-1,3-butyleneglycol acetate, 1,3-butyleneglycol-3-monomethyl ether, methyl pyruvate, ethyl pyruvate, methyl-3-methoxypropionate or the like, which may be used alone or in combination of two or more.

A positive photosensitive resin composition in the present invention may contain, if necessary, additives such as a leveling agent, a silane coupling agent and the like.

In the present invention, these components are dissolved in a solvent to prepare a varnish, which is used. Examples of the solvent include N-methyl-2-pyrrolidone, γ-butyrolactone, N,N-dimethylacetamide, dimethylsulfoxide, diethyleneglycol dimethyl ether, diethyleneglycol diethyl ether, diethyleneglycol dibutyl ether, propyleneglycol monomethyl ether, dipropyleneglycol monomethyl ether, propyleneglycol monomethyl ether acetate, methyl lactate, ethyl lactate, butyl lactate, methyl-1,3-butyleneglycol acetate, 1,3-butyleneglycol-3-monomethyl ether, methyl pyruvate, ethyl pyruvate, methyl-3-methoxypropionate or the like, which may be used alone or in combination of two or more.

In a method for using a positive photosensitive resin composition of the present invention, first the composition is applied to a suitable support such as a silicon wafer, a ceramic substrate an aluminum substrate and the like. The application amount is an amount such that for a semiconductor device, a final layer thickness becomes 0.1 to 30 μm after curing. A layer with a thickness less than the lower limit may be difficult in performing enough function as a protective surface layer for a semiconductor chip, while a layer with a thickness more than the upper limit becomes difficult to give a fine processing pattern and takes much time for the processing, leading to a reduced throughput. Examples of application method can include spin-coating using a spinner, spraying using a spray coater, immersion, printing, roll coating or the like. Next, the layer is prebaked at 60 to 130° C. to dry the coating layer and then is irradiated with chemical rays in a desired pattern. Examples of the chemical rays which can be used include X-ray, electron beam, ultraviolet ray, visible light and the like, preferably rays with a wavelength of 200 to 500 nm.

Next, the irradiated part is removed by dissolving in a developer to form a relief pattern. Examples of the developer include aqueous solutions of an inorganic alkali such as sodium hydroxide, potassium hydroxide, sodium carbonate, sodium silicate, sodium metasilicate and ammonia; a primary amine such as ethylamine and n-propylamine; a secondary amine such as diethylamine and di-n-propylamine; a tertiary amine such as triethylamine and methyldiethylamine; an alcoholamine such as dimethylethanolamine and triethanolamine; a quaternary ammonium salt such as tetramethylammonium hydroxide and tetraethylammonium hydroxide; and these aqueous solutions added with a water-soluble organic solvent such as an alcohol including methanol and ethanol and a surfactant in appropriate amount. Example of the development method may be conducted by, for example, spraying, paddling, immersion ultrasonication or the like.

Then, the relief pattern formed by development is rinsed. A rinse agent for use is distilled water. Subsequently, it is heated for forming an oxazole ring and/or an imide ring to give a final pattern with excellent heat resistance.

In terms of a development mechanism of this positive photosensitive resin composition, an unexposed area becomes insoluble in an aqueous alkali solution due to a diazoquinone compound preventing dissolution of a resin such as a polybenzoxazole resin and a polyimide resin. On the other hand, an exposed area becomes soluble in an aqueous alkali solution because of chemical change of a diazoquinone compound. By removing the exposed area by dissolution utilizing a solubility difference between the exposed and the unexposed areas, a coating layer pattern only in the unexposed area can be formed.

A positive photosensitive resin composition of the present invention is not only useful in applications for the semiconductor, but also useful as an interlayer insulating layer in a multilayered circuit board or a cover coat in a flexible copper-clad plate, a solder resist layer or a liquid-crystal oriented layer, an interlayer insulating layer in a device in a display and the like.

A positive photosensitive resin composition of the present invention can be used for semiconductor device applications; for example, it can be used as an insulating layer such as a passivation layer by forming a layer of the above positive photosensitive resin composition on a semiconductor chip, a protective layer by forming a layer of the above positive photosensitive resin composition on a passivation layer formed on a semiconductor element, and an interlayer insulating layer by forming a layer of the above positive photosensitive resin composition on or over a circuit formed on a semiconductor chip.

In addition a positive photosensitive resin composition according to the present invention can be used for display applications; for example, it can be used as an insulating layer such as an interlayer insulating layer for a TFT, a flattened layer such as a flattened layer for a TFT device and a flattened layer for a color filter, a projection for an MVA type liquid crystal display or a cathode septum for an organic EL element. Its application method involves, according to application for the semiconductor device, forming a patterned positive photosensitive resin composition layer on or over a substrate with a display element and a color filter by the above-mentioned method. For display applications, particularly an interlayer insulating layer or a flattened layer, require high transparency, and introduction of a post-exposure process before curing a layer of this positive photosensitive resin composition can allow for forming a highly transparent resin layer and thus the composition of the present invention is practically further preferable.

EXAMPLES

Experimental Example A1

Synthesis of a Polyamide Resin

In a four-necked separable flask equipped with a thermometer, a stirrer, a material input port and a dry nitrogen gas inlet tube were placed a mixture of dicarboxylic acid derivatives (0.016 mol) prepared by reacting 4.13 g of diphenyl ether-4,4'-dicarboxylic acid (0.016 mol) with 4.32 g of 1-hydroxy-1,2,3-benzotriazole (0.032 mol) and 7.33 g of hexafluoro-2,2-bis(3-amino-4-hydroxyphenyl)propane (0.020 mol), to which 57.0 g of N-methyl-2-pyrrolidone was added to be dissolved. Then, the mixture was reacted at 75° C. for 12 hours using an oil bath. Then, to the mixture was added 1.31 g of 5-norbornene-2,3-dicarboxylic anhydride (0.008 mol) dissolved in 7 g of N-methyl-2-pyrrolidone, and the resulting mixture was stirred for additional 12 hours for completing the reaction. After filtration of the reaction mixture, the reaction mixture was poured into a solution of water/methanol=3/1 (volume ratio), and the precipitate was collected by filtration, thoroughly washed with water and dried in vacuo to provide a desired polyamide resin (A-1).

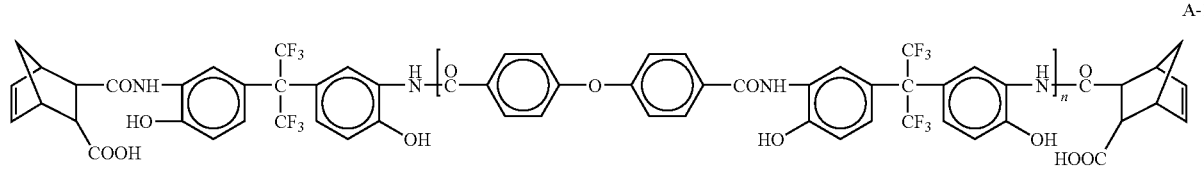

A-1

In this FIGURE, n is an integer of 1 or more.

Preparation of a Resin Composition

In 20 g of γ-butyrolactone were dissolved 10 g of the polyamide resin (A-1) synthesized, 2 g of a photosensitive diazoquinone (B-1) having the structure illustrated below, 0.8 g of an activated silicon compound having the structure of below formula (d1-1) and 0.1 g of an aluminum complex having the structure of below formula (d2-1), and the mixture was filtrated by a 0.2 μm fluororesin filter to give a positive photosensitive resin composition.

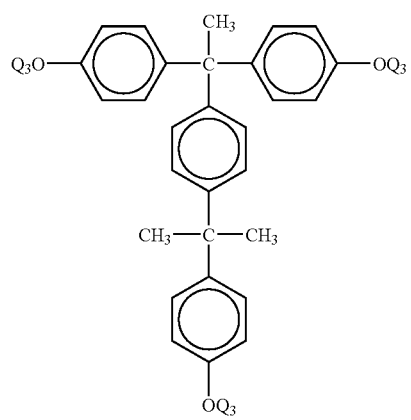

B-1

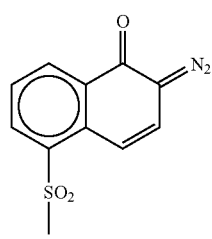

(4)

In these formulas, 75% of Q1, Q2 and Q3 is represented by formula (4) and 25% is a hydrogen atom.

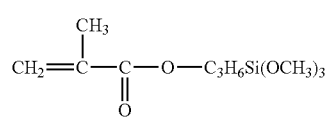

d1-1

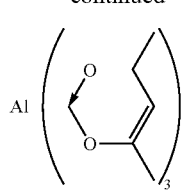

Evaluation of Development Properties

Using a spin coater, on a 8 inch silicon wafer was applied a positive photosensitive resin composition, which was then dried at 120° C. for 4 min on a hot plate to give a coating layer with a thickness of about 10 μm. The resulting coating layer was exposed under stepwise increase of an exposure amount from 100 mJ/cm² to 10 mJ/cm² through a mask from Toppan Printing Co., Ltd. (Test Chart No. 1, in which a remaining pattern and a removing pattern with a width of 0.88 to 50 μm were drawn) using i-line stepper NSR-4425i from Nikon Corporation. Then, the exposed area was removed by dissolution while adjusting a development time such that a layer thinning was 1.5 μm during development in a 2.38% aqueous solution of tetramethylammonium hydroxide, and then rinsed with pure water for 30 sec. Observation of the pattern indicated that at an exposure amount of 350 mJ/cm², the pattern was satisfactorily opened with no scums.

Evaluation of a Cyclization Rate

The wafer obtained in the evaluation of development properties was cured at 150° C./30 min+250° C./60 min under a nitrogen atmosphere using a clean oven from Koyo Thermo Systems Co., Ltd. (CLH-21CDH). This curing temperature is lower than a conventional typical cyclization temperature of 320° C./60 min. Therefore, evaluation of a cyclization rate under these conditions allows for determining cyclization status at a low temperature.

Then, the wafer was immersed in a 2% aqueous solution of hydrofluoric acid to remove the cured layer from the silicon wafer for determining a cyclization rate. Separately, curing was conducted at 150° C./30 min+320° C./60 min and the same procedure was conducted, to obtain a cured layer. A cyclization rate was calculated by the following procedure using an infrared spectrometer (FT-IR), and was as high as 80%.

Determination of a Cyclization Rate

A cyclization rate was calculated from the following equation using an FT-IR (Parkin Elmer Paragon 1000) as an apparatus.

Cyclization rate (%)={(B/A)/(D/C)}×100

A: a peak length due to all aromatic rings at 1490 cm⁻¹ in 250° C. curing

B: a peak length due to cyclization at 1051 cm⁻¹ in 250° C. curing

C: a peak length due to all aromatic rings at 1490 cm⁻¹ in 320° C. curing

D: a peak length due to cyclization at 1051 cm⁻¹ in 320° C. curing

Evaluation of Corrosion Properties

The obtained positive photosensitive resin composition was applied on a silicon wafer (TEG-3) with a comb-shaped aluminum circuit, and dried on a hot plate at 120° C. for 4 min. Then, curing was conducted as described above at 150° C./30 min+250° C./60 min. Subsequently, the obtained wafer was treated by a pressure cooker under the conditions of 125° C., a relative humidity of 100% and 2.3 atm, and observation of an aluminum circuit by metallographic microscopy indicated no corrosion in the aluminum circuit.

Experimental Example A2

Synthesis of a Polyamide Resin

In a four-necked separable flask equipped with a thermometer, a stirrer, a material input port and a dry nitrogen gas inlet tube were placed 6.82 g of 4,4'-oxydiphthalic anhydride (0.022 mol), 3.26 g of 2-methyl-2-propanol (0.044 mol) and 10.9 g of pyridine (0.138 mol), to which and 150 g of N-methyl-2-pyrrolidone was added to be dissolved. Into the reaction solution was added dropwise 5.95 g of 1-hydroxy-1,2,3-benzotriazole (0.044 mol) with 30 g of N-methyl-2-pyrrolidone, and then added dropwise 22.7 g of dicyclohexylcarbodiimide (0.10 mol) with 50 g of N-methyl-2-pyrrolidone, and the mixture was reacted at room temperature overnight. Then, to this reaction solution were added 43.34 g of a dicarboxylic acid derivative (active ester) prepared by reacting 1 mol of diphenyl ether-4,4'-dicarboxylic acid with 2 mol of 1-hydroxy-1,2,3-benzotriazole (0.088 mol) and 44.7 g of hexafluoro-2,2-bis(3-amino-4-hydroxyphenyl)propane (0.122 mol) with 70 g of N-methyl-2-pyrrolidone, and the mixture was stirred at room temperature for 2 hours. Subsequently, the mixture was reacted at 75° C. for 12 hours using an oil bath.

Then, to the mixture was added 3.94 g of 5-norbornene-2,3-dicarboxylic anhydride (0.024 mol) dissolved in 20 g of N-methyl-2-pyrrolidone, and the mixture was stirred for additional 12 hours to complete the reaction. The subsequent procedure was conducted as described in Experimental Example A1, except that the reaction mixture was filtrated and then poured into a solution of water/methanol=3/1 (volume ratio), and a precipitate was collected by filtration, thoroughly washed with water, re-precipitated and purified to give a desired polyamide resin (A-2).

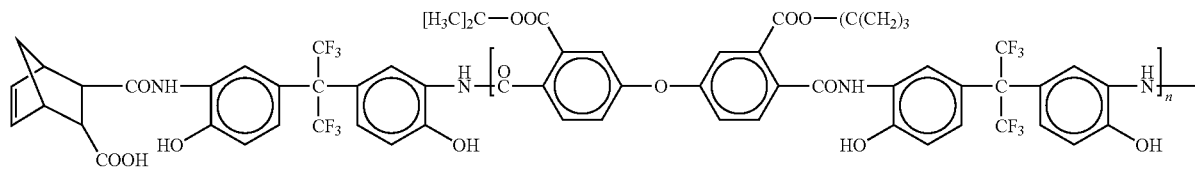

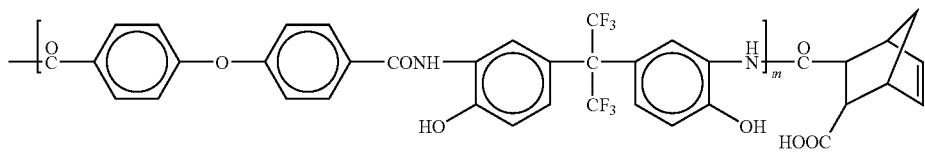

In this formula, n and m are an integer of 1 or more.

Preparation of a Resin Composition

In 20 g of γ-butyrolactone were dissolved 10 g of the synthesized polyamide resin (A-2), 1.5 g of a photosensitive diazoquinone (B-2) having the structure illustrated below, 1.5 g of an activated silicon compound having the structure of below formula (d1-2) (triethoxy(4-(trifluoromethyl)phenyl) silane) and 0.5 g of an aluminum complex having the structure of below formula (d2-2) (aluminum ethyl acetoacetate diisopropylate), and the mixture was filtrated by a 0.2 μm fluororesin filter to give a positive photosensitive resin composition. This resin composition was also evaluated as described in Experimental Example A1.

B-2:

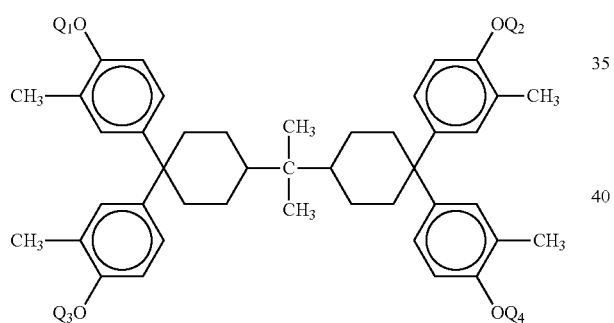

(4)

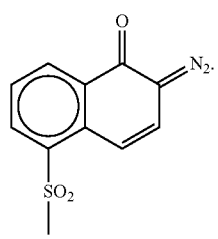

In these formulas, 87.5% of Q1, Q2 and Q3 is represented by formula (4) and 12.5% is a hydrogen atom.

d1-2

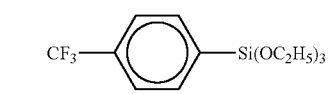

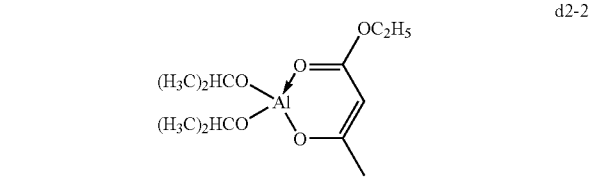

Experimental Example A3

A positive resin composition was prepared as described in Experimental Example A1 without an aluminum complex compound (d2-1). This resin composition was evaluated as described in Experimental Example A1. The evaluation results are shown in Table 1.

Experimental Example A4

A positive resin composition was prepared as described in Experimental Example A1 without an activated silicon compound (d1-1). This resin composition was evaluated as described in Experimental Example A1. The evaluation results are shown in Table 1.

Experimental Example A5

A positive resin composition was prepared as described in Experimental Example A1, substituting 0.1 g of p-toluenesulfonic acid for an aluminum complex compound (d2-1) without a silicon compound (d1-1). This resin composition was evaluated as described in Experimental Example A1. The evaluation results are shown in Table 1.

Experimental Example A6

A positive resin composition was prepared as described in Experimental Example A1, without a silicon compound (d1-1) and an aluminum complex compound (d2-1). This resin composition was evaluated as described in Experimental Example A1. The evaluation results are shown in Table 1.

TABLE 1

| | | (A) Alkali-soluble resin (g) | (B) Diazoquinone compound (g) | (C) Activated silicon compound (g) | (D) Aluminum complex (g) | Sensitivity (mJ/cm²) | Cyclization rate (%) | Corrosion properties |
|---|---|---|---|---|---|---|---|---|
| Experimental Example | A1 | A-1(10) | B-1(2.0) | d1-1(0.8) | d2-1(0.1) | 350 | 80 | None |
| | A2 | A-2(10) | B-2(1.5) | d1-2(0.5) | d2-2(0.5) | 370 | 84 | None |
| | A3 | A-1(10) | B-1(2.0) | d1-1(1.0) | — | 340 | 63 | None |
| | A4 | A-1(10) | B-1(2.0) | — | d2-1(0.1) | 350 | 58 | None |
| | A5 | A-1(10) | B-1(2.0) | — | p-TS*[1](0.1) | 360 | 86 | Observed |
| | A6 | A-1(10) | B-1(2.0) | — | — | 350 | 64 | None |

*[1]p-Toluenesulfonic acid

Experimental Example A7

One of application examples of a positive photosensitive resin composition of the present invention to a semiconductor device will be described for application to a semiconductor device having a bump with the drawing. FIG. 1 is an enlarged cross sectional view of a pad in a semiconductor device of the present invention having a bump. As shown in FIG. 1, over a silicon substrate 1 having a semiconductor chip and an interconnection on its surface are formed an Al pad 2 for input/output, on which is formed a passivation layer 3 having a via hole. On the surface is applied a positive photosensitive composition of the present invention, which is then dried to form a positive photosensitive resin (buffer coat layer) 4. Furthermore, a metal (for example, Cr, Ti or the like) layer 5 is formed such that it is connected to the Al pad 2, and the metal layer 5 etches the periphery of a solder bump 9 to insulate between the pads. Over the insulated pad, a barrier metal 8 and a solder bump 9 are formed. In this FIGURE, 6 is an interconnection (for example, Al, Cu or the like) and 7 is an insulating layer.

The semiconductor device thus obtained is manufactured in a high yield and exhibits higher reliability.

Experimental Example A8

After forming an ITO layer on a glass substrate by vapor deposition, the ITO layer was divided in a stripe form by ordinary photolithography using a photoresist. On the layer was applied the positive photosensitive resin composition prepared in Experimental Example A1 to form a resin layer with a thickness of about 2 μm. Then, it was exposed at an exposure strength of 25 mW/cm² for 10 sec through a glass mask, using a collimated exposure machine (light source: a high-pressure mercury-vapor lamp). Then, by immersing the resin layer in an 2.38% aqueous solution of tetramethylammonium hydroxide for 20 sec for development, the areas other than the edge of the ITO on each stripe were exposed, and the layer was processed such that the resin layer was formed on the edge of the ITO layer and the area where the ITO layer had been removed. Then, the whole resin layer was post-exposed at an exposure strength of 25 mW/cm² for 40 sec using the collimated exposure machine used in the exposure, and then cured by heating at 230° C. for 1 hour in the air using a hot air circulation drying machine.

On this substrate were vapor-deposited under a reduced pressure of 1×10⁻⁴ Pa or less, copper phthalocyanine as a hole injection layer and bis-N-ethyl carbazole as a hole transport layer, and then N,N'-diphenyl-N,N'-m-toluoyl-4,4'-diamino-1,1'-biphenyl as a luminescent layer and tris(8-quinolinolate) aluminum as an electron injection layer, in sequence. Furthermore, on the surface was formed by vapor deposition an aluminum layer as a second electrode, which was divided as a stripe orthogonal to the above ITO-layer stripe by ordinary photolithography using a photoresist. After drying the obtained substrate in vacuo, an sealing glass plate was attached to it by using an epoxy adhesive to prepare a display. The display was heated at 80° C. for 200 hours and then sequentially activated by applying a voltage between both electrodes, resulting in satisfactory light emission of the display.

The device according to this example is manufactured in a high yield and exhibits higher reliability.

Experimental Example B1

Preparation of a Resin Composition

In 20 g of γ-butyrolactone were dissolved 10 g of the polyamide resin (A-1) synthesized in Experimental Example A1, 2 g of a photosensitive diazoquinone (B-1) having the above structure, 3 g of an oxetanyl-containing compound having the structure represented by below formula (C-1), 0.8 g of a silicon compound having the structure represented by below formula (d1-1) and 0.1 g of an aluminum chelate having the structure represented by below formula (d2-1), and then the solution was filtrated through a 0.2 μm fluororesin filter, to obtain a positive photosensitive resin composition.

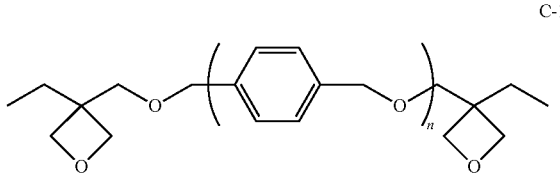

C-1

Evaluation of Development Properties

The obtained positive photosensitive resin composition was evaluated for its development properties as described above. Observation of the pattern indicated that at an exposure amount of 350 mJ/cm², the pattern was satisfactorily opened with no scums.

Evaluation of Reflow Resistance

The above patterned wafer was heated for curing in a clean oven at 150° C./30 min and 250° C./60 min under a nitrogen atmosphere. Then, to this wafer was applied a flux BF-30 from Tamura Kaken Corporation using a spinner under the conditions of 500 rpm/30 sec+1000 rpm/30 sec. The wafer was passed twice through a reflow oven under the conditions of 140 to 200° C./120 sec (pre-heating) and 250° C./60 sec. After washing with xylene for 10 min, the wafer was rinsed with isopropyl alcohol and dried. After removing the flux, observation by a metaloscope indicated a satisfactory layer surface with no cracks or folds.

Evaluation of Chemical Resistance

The above patterned wafer was cured in a clean oven at 150° C./30 min+250° C./60 min under a nitrogen atmosphere. Then, the cured wafer was immersed in STRIPPER-106 from Tokyo Ohka Kogyo Co., Ltd. at room temperature for 5 minutes. Next, the wafer was rinsed with isopropyl alcohol at room temperature and then dried. Observation by a metaloscope indicated a surface with no cracks, folds or peelings.

Determination of a Cyclization Rate

A cyclization rate was calculated as described in Experimental Example A1.

Experimental Example B2

Synthesis of a Polyamide Resin

In a four-necked separable flask equipped with a thermometer, a stirrer, a material input port and a dry nitrogen gas inlet tube were placed 17.06 g of 4,4'-oxydiphthalic anhydride (0.055 mol), 8.15 g of 2-methyl-2-propanol (0.110 mol) and 10.9 g of pyridine (0.138 mol), to which was then added 150 g of N-methyl-2-pyrrolidone to be dissolved. To the reaction solution was added dropwise 14.9 g of 1-hydroxy-1,2,3-benzotriazole (0.110 mol) with 30 g of N-methyl-2-pyrrolidone, and then added dropwise 22.7 g of dicyclohexylcarbodiimide (0.110 mol) with 50 g of N-methyl-2-pyrrolidone, and the mixture was reacted at room temperature overnight. Then, to this reaction solution were added 27.1 g of a dicarboxylic acid derivative (active ester) prepared by reacting 1 mol of diphenyl ether-4,4'-dicarboxylic acid with 2 mol of 1-hydroxy-1,2,3-benzotriazole (0.055 mol) and 44.7 g of hexafluoro-2,2-bis(3-amino-4-hydroxyphenyl)propane (0.122 mol) with 70 g of N-methyl-2-pyrrolidone, and the mixture was stirred at room temperature for 2 hours. Subsequently, the mixture was reacted at 75° C. for 12 hours using an oil bath.

Then, to the mixture was added 3.94 g of 5-norbornene-2,3-dicarboxylic anhydride (0.024 mol) dissolved in 20 g of N-methyl-2-pyrrolidone, and the mixture was stirred for additional 12 hours to complete the reaction. The subsequent procedure was conducted as described in Experimental Example A1, except that the reaction mixture was filtrated and then poured into a solution of water/methanol=3/1 (volume ratio), and a precipitate was collected by filtration, thoroughly washed with water, re-precipitated and purified to give a desired polyamide resin (A'-2).

In this formula, n and m are an integer of 1 or more.

Preparation of a Resin Composition and Evaluation of Development Properties

In 20 g of γ-butyrolactone were dissolved 10 g of the synthesized polyamide resin (A'-2), 1.5 g of a photosensitive diazoquinone (B-2) having the structure illustrated above, 3 g of an oxetanyl-containing compound having below formula (C-2), 0.8 g of a silicon compound having the structure of below formula (d1-2) and 0.3 g of an aluminum chelate having the structure of below formula (d2-2), and the mixture was filtrated by a 0.2 μm fluororesin filter to give a positive photosensitive resin composition.

This resin composition was also evaluated in Experimental Example B1.

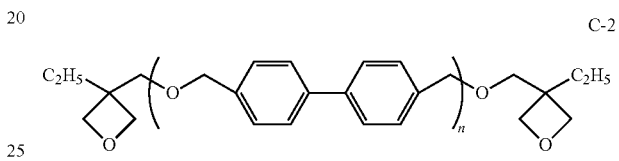

C-2

Experimental Example B3

A positive resin composition was prepared in Experimental Example B1, using 0.3 g of catalyst (E-1). This resin composition was evaluated as Experimental Example B1.

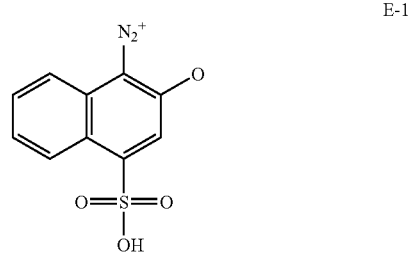

E-1

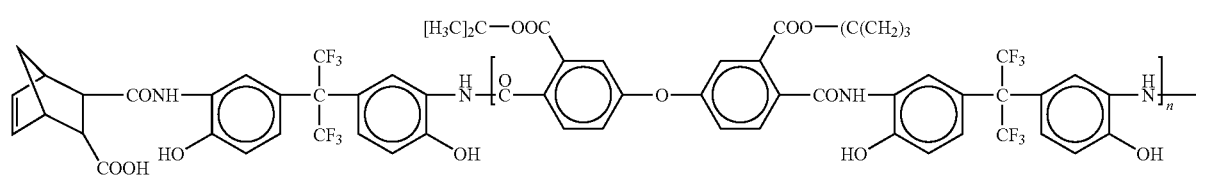

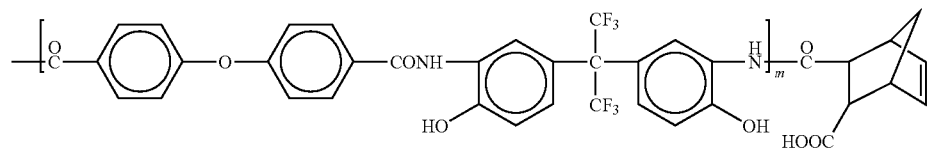

A'-2

Experimental Example B4

A positive resin composition was prepared in Experimental Example B1, using 0.3 g of catalyst (E-2). This resin composition was evaluated as Experimental Example B1.

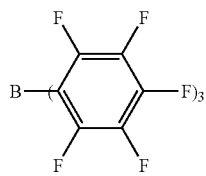

E-2

TABLE 2

| | | Content | | | | Properties | | | | |
|---|---|---|---|---|---|---|---|---|---|---|
| | | (A) Alkali-soluble resin (g) | (B) Diazoquinone compound (g) | (C) Compound having two or more oxetanyl groups in one melecule (g) | (D) Acid-generating substance (g) | Development properties | | Cyclization rate (%) | Reflow resistance | Chemical resistance |
| | | | | | | Sensitivity (mJ/cm²) | Scum | | | |
| Experimental Example | B1 | A'-1(10) | B-1(2.0) | C-1(3.0) | d1-1(0.8)/d2-1(0.3) | 350 | None | 82 | Unchanged | Unchanged |
| | B2 | A'-2(10) | B-2(1.5) | C-2(3.0) | d1-2(0.8)/d2-2(0.3) | 370 | None | 85 | Unchanged | Unchanged |
| | B3 | A'-1(10) | B-1(2.0) | C-1(3.0) | E-1(0.3) | 330 | None | 85 | Unchanged | Unchanged |
| | B4 | A'-1(10) | B-1(2.0) | C-1(3.0) | E-2(0.3) | 350 | None | 83 | Unchanged | Unchanged |
| | B5 | A'-1(10) | B-1(2.0) | | d1-1(0.8)/d2-1(0.3) | 340 | None | 83 | Folds | Dissolution |
| | B6 | A'-1(10) | B-1(2.0) | | | 350 | None | 56 | Folds | Folds |

Experimental Example B5

A positive resin compassion was prepared in Experimental Example B1 without the oxetanyl-containing compound (C-1). This resin composition was evaluated as Experimental Example B1.

Experimental Example B6

A positive resin composition was prepared in Experimental Example B1 without the oxetanyl-containing compound (C-1), catalyst (d1-1) and (d2-1). This resin composition was evaluated as Experimental Example B1.

Experimental Example B7

After forming an ITO layer on a glass substrate by vapor deposition, the ITO layer was divided in a stripe form by ordinary photolithography using a photoresist. On the layer was applied the positive photosensitive resin composition prepared in Experimental Example B1 to form a resin layer with a thickness of about 2 μm. Then, it was exposed at an exposure strength of 25 mW/cm² for 10 sec through a glass mask, using a collimated exposure machine (light source: a high-pressure mercury-vapor lamp). Then, by immersing the resin layer in an 2.38% aqueous solution of tetramethylammonium hydroxide for 20 sec for development, the areas other than the edge of the ITO on each stripe were exposed, and the layer was processed such that the resin layer was formed on the edge of the ITO layer and the area where the ITO layer had been removed. Then, the whole resin layer was post-exposed at an exposure strength of 25 mW/cm² for 40 sec using the collimated exposure machine used in the exposure, and then cured by heating at 250° C. for 1 hour in the air using a hot air circulation drying machine.

This substrate was further processed as described in Experimental Example A4 to prepare a display. The display was heated at 80° C. for 200 hours and then sequentially activated by applying a voltage between both electrodes, resulting in satisfactory light emission of the display.

The device according to this example is manufactured in a high yield and exhibits higher reliability.

The invention claimed is:

1. A positive photosensitive resin composition comprising
   (A) an alkali-soluble resin,
   (B) a diazoquinone compound,
   (d1) an activated silicon compound having an Si—O—C bond, and
   (d2) an aluminum complex.

2. The positive photosensitive resin composition as claimed in claim 1, wherein said (d1) activated silicon compound is a compound having an alkoxysilane bond.

3. The positive photosensitive resin composition as claimed in claim 1, wherein said (A) alkali-soluble resin is a resin comprising a polybenzoxazole structure, a polybenzoxazole precursor structure, a polyimide structure, a polyimide precursor structure or a polyimide acid ester structure.

4. The positive photosensitive resin composition as claimed in claim 1, wherein said (A) alkali-soluble resin is a resin represented by general formula (1):

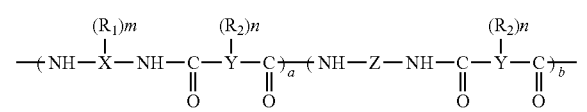

(1)

wherein X and Y are an organic group; a and b represent a molar percentage, a+b=100, a is 60 or more and 100 or less and b is 0 or more and 40 or less; $R_1$ is a hydroxy group or —O—$R_3$, which may be the same or different;

$R_2$ is a hydroxy group, a carboxyl group, —O—$R_3$ or —COO—$R_3$, which may be the same or different; m is a positive number of 0 to 2; n is a positive number of 0 to 4; $R_3$ is an organic group having 1 to 15 carbon atoms, where when $R_1$s are not a hydroxy group, at least one of $R_2$s must be a carboxyl group and where when $R_2$s are not a carboxyl group, at least one of $R_1$s must be a hydroxy group; Z is represented by —$R_4$—Si($R_6$)($R_7$)—O—Si ($R_6$)($R_7$)—$R_5$— where $R_4$ to $R_7$ are an organic group.

5. A patterning process comprising
applying the positive photosensitive resin composition as claimed in claim 1 on a substrate to form a resin layer,
irradiating a desired area in said resin layer with an active energy beam,
developing said resin layer after the irradiation with an active energy beam and then
heating said resin layer, wherein the heating step causes the activated silicon compound to generate a silanol group which reacts with the aluminum complex compound to generate a Broensted acid which catalyzes the cyclization of the alkali-soluble resin.

6. A semiconductor device, comprising
a semiconductor substrate,
a semiconductor chip formed on or over said semiconductor substrate,
a protective layer or insulating layer formed over said semiconductor chip,
wherein said protective layer or insulating layer is a layer formed by applying, developing and heating the positive photosensitive resin composition as claimed in claim 1.

7. A display comprising a substrate for a display device, a flattened layer or insulating layer covering the surface of said substrate and a display device formed over said substrate for a display device,
wherein said flattened layer or insulating layer is a layer formed by applying, developing and heating the positive photosensitive resin composition as claimed in claim 1.

8. A process for manufacturing a semiconductor device comprising a semiconductor chip and a protective layer or insulating layer formed over said semiconductor chip, comprising
applying a positive photosensitive resin composition on said semiconductor chip and drying said composition to form a resin layer,
irradiating a desired area in said resin layer with an active energy beam,
developing said resin layer after the irradiation with an active energy beam, and then
heating said resin layer to form said protective layer or insulating layer, wherein the heating step causes the activated silicon compound to generate a silanol group which reacts with the aluminum complex compound to generate a Broensted acid which catalyzes the cyclization of the alkali-soluble resin,
wherein said positive photosensitive resin composition is the positive photosensitive resin composition as claimed in claim 1.

9. A process for manufacturing a display comprising a substrate, a flattened layer or insulating layer covering the surface of said substrate and a display device formed over said substrate for a display device, comprising
applying a positive photosensitive resin composition on said substrate to form a resin layer,
irradiating a desired area in said resin layer with an active energy beam,
developing said resin layer after the irradiation with an active energy beam, and then
heating said resin layer to form said flattened layer or insulating layer, wherein the heating step causes the activated silicon compound to generate a silanol group which reacts with the aluminum complex compound to generate a Broensted acid which catalyzes the cyclization of the alkali-soluble resin,
wherein said positive photosensitive resin composition is the positive photosensitive resin composition as claimed in claim 1.

10. A positive photosensitive resin composition comprising
(A) an alkali-soluble resin, which is a resin comprising a polybenzoxazole structure, a polybenzoxazole precursor structure, a polyimide structure, a polyimide precursor structure or a polyamide acid ester structure
(B) a diazoquinone compound,
(C) a compound having two or more oxetanyl groups in one molecule, and
(D) a catalyst for accelerating the ring-opening reaction of said oxetanyl groups of compound (C), wherein said (D) component is selected from the group consisting of onium salts, halogenated organic compounds, quinone diazide compounds and sulfone compounds.

11. The positive photosensitive resin composition as claimed in claim 10, wherein said (D) component is an acid-generating agent.

12. The positive photosensitive resin composition as claimed in claim 10, wherein said (D) component comprises an aluminum complex and an activated silicon compound.

13. The positive photosensitive resin composition as claimed in claim 10, wherein said (A) alkali-soluble resin is a resin represented by general formula (1):

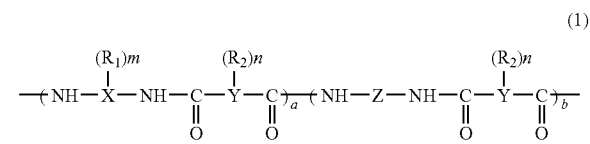

wherein X and Y are an organic group; a and b represent a molar percentage, a+b=100, a is 60 or more and 100 or less and b is 0 or more and 40 or less; $R_1$ is a hydroxy group or —O—$R_3$, which may be the same or different; $R_2$ is a hydroxy group, a carboxyl group, —O—$R_3$ or —COO—$R_3$, which may be the same or different; m is a positive number of 0 to 2; n is a positive number of 0to 4; $R_3$ is an organic group having 1 to 15 carbon atoms, where when $R_1$s are not a hydroxy group, at least one of $R_2$s must be a carboxyl group and where when $R_2$s are not a carboxyl group, at least one of $R_1$ s must be a hydroxy group; Z is represented by —$R_4$—Si($R_6$)($R_7$)—O—Si ($R_6$)($R_7$)—$R_5$— where $R_4$ to $R_7$ are an organic group.

14. A patterning process comprising
applying the positive photosensitive resin composition as claimed in claim 10 on a substrate to form a resin layer,
irradiating a desired area in said resin layer with an active energy beam,
developing said resin layer after the irradiation with an active energy beam and then
heating said resin layer.

15. A semiconductor device, comprising
a semiconductor substrate,
a semiconductor chip formed on or over said semiconductor substrate,
a protective layer or insulating layer formed over said semiconductor chip,
wherein said protective layer or insulating layer is a layer formed by applying, developing and heating the positive photosensitive resin composition as claimed in claim 10.

16. A display comprising a substrate for a display device, a flattened layer or insulating layer covering the surface of said substrate and a display device formed over said substrate for a display device,
wherein said flattened layer or insulating layer is a layer formed by applying, developing and heating the positive photosensitive resin composition as claimed in claim 10.

17. A process for manufacturing a semiconductor device comprising a semiconductor chip and a protective layer or insulating layer formed over said semiconductor chip, comprising
applying a positive photosensitive resin composition on said semiconductor chip and drying said composition to form a resin layer,
irradiating a desired area in said resin layer with an active energy beam,
developing said resin layer after the irradiation with an active energy beam, and then
heating said resin layer to form said protective layer or insulating layer,
wherein said positive photosensitive resin composition is the positive photosensitive resin composition as claimed in claim 10.

18. A process for manufacturing a display comprising a substrate, a flattened layer or insulating layer covering the surface of said substrate and a display device formed over said substrate for a display device, comprising
applying a positive photosensitive resin composition on said substrate and drying the composition to form a resin layer,
irradiating a desired area in said resin layer with an active energy beam,
developing said resin layer after the irradiation with an active energy beam, and then
heating said resin layer to form said flattened layer or insulating layer,
wherein said positive photosensitive resin composition is the positive photosensitive resin composition as claimed in claim 10.

* * * * *